United States Patent
Chen et al.

(10) Patent No.: US 6,313,428 B1
(45) Date of Patent: Nov. 6, 2001

(54) APPARATUS AND METHOD FOR REDUCING SPACE CHARGE OF ION BEAMS AND WAFER CHARGING

(75) Inventors: Jin-Liang Chen, Cupertino; Linuan Chen, San Jose, both of CA (US)

(73) Assignee: Advanced Ion Beam Technology, Inc., Sunnyvale, CA (US)

(*) Notice: Subject to any disclaimer, the term of this patent is extended or adjusted under 35 U.S.C. 154(b) by 0 days.

(21) Appl. No.: 09/416,574

(22) Filed: Oct. 12, 1999

(51) Int. Cl.[7] ................................................. B23K 10/00
(52) U.S. Cl. ........................ 219/121.43; 219/121.33; 219/121.48; 219/121.49; 250/492.1
(58) Field of Search ...................... 219/121.43, 121.48, 219/121.49, 121.59, 121.21, 121.33; 250/492.1, 492.2, 492.21, 251; 204/298.12

(56) References Cited

U.S. PATENT DOCUMENTS

| | | | |
|---|---|---|---|
| 3,865,625 | * 2/1975 | Yi Cho et al. | 117/212 |
| 4,252,626 | * 2/1981 | Wright et al. | 204/192 R |
| 4,825,087 | * 4/1989 | Renau et al. | 250/492.2 |
| 5,399,871 | * 3/1995 | Ito et al. | 250/251 |
| 5,951,886 | * 9/1999 | Schubert et al. | 219/121.13 |

* cited by examiner

*Primary Examiner*—Mark Paschall
(74) *Attorney, Agent, or Firm*—Bo-In Lin

(57) ABSTRACT

An apparatus for ion beam neutralization is disclosed in this invention. The apparatus is a plasma flood source with an arc discharge chamber enclosed in a source housing with sufficient cooling so that the housing temperature is near room temperature. Arc discharge between a filament and the arc chamber ionizes the bleeding gas atoms or molecules in the arc chamber and produces plasma. The low energy electrons together with ions in the plasma drift out of the arc chamber and neutralize the passing ion beam. The sufficiently cooled source housing prevents radiation to the processed wafers, reduces metal particle concentration in the plasma and therefore metal contamination on the wafers, and keeps beamline pressure low while more electrons are extracted from the flood source through the apertures with larger area.

35 Claims, 3 Drawing Sheets

APPARATUS AND METHOD FOR REDUCING SPACE CHARGE OF ION BEAMS AND WAFER CHARGING

BACKGROUND OF THE INVENTION

1. Field of the Invention

This invention relates generally to the ion implantation systems and methods employed in the fabrication process for manufacturing semiconductor devices. More particularly, this invention relates to apparatus for effecting the ion beam neutralization for ion implantation and, more particularly, relates to an apparatus for neutralizing a positively charged ion beam by providing low energy electrons from a sufficiently cooled plasma flood source.

2. Description of the Prior Art

Electrical charge buildup on a wafer surface when ion beams are applied for implantation is still a technical difficulty faced by the semiconductor industries. Ion implantation has been used as a standard way to dope impurities, such as boron, phosphorus, and arsenic, into semiconductor materials for more than two decades. Its property of controllable doping direction makes it irreplaceable by other doping techniques in manufacturing sub-micron integrated circuits. An ion implanter used for ion implantation purpose usually includes an ion source, ion beam transport optics, and a process chamber where ion implantation occurs. An electron or plasma flood source is always an important component of an implanter. Not only can it help to reduce charge build-up on target wafers, but also it can help to increase ion beam transportation efficiency to the target wafers, especially for low-energy ion beams.

It is well known in the art of integrated circuit (IC) manufacture that a charged ion beam will produce a buildup of charge on the surface of the semiconductor target. This charge may not be removed from the surface of insulating and semi-conductive wafer material. In this situation, positive charge builds up on the surface of the material since most ion beams are positively charged. Such charge may interfere automatic wafer handling due to sticking, may break through layers of micro-circuitry, and may affect implant uniformity due to charged portions of the wafer surface deflecting the ion beam. The presence of such surface charges therefore is believed to reduce yields in the production of integrated circuits.

One effective way to reduce positive charge build-up on wafer surface is to supply similar amount of negative charges, e.g. electrons, on the wafer surface. Electron or plasma flood sources, or alternatively called electron or plasma shower sources, are usually used to supply these electrons and introduce them onto the wafer as the ion beam strikes the wafer surface. As the requirement of implantation expands towards low energy ions with large current, e.g. for shallow junction formation, electron and plasma floods were also used to reduce space charge blow-up and to enhance the transportation of low energy ion beams with large currents.

To achieve the dual purposes of reducing wafer charging and space charge blow-up, electrons are directed towards the passing ion beam instead towards the target wafers, since the direct application of electrons to the wafers can produce contamination from the filament of the electron source. The direct radiation from the filament can cause wafer heating and non-uniformity across the wafer during implantation. The primary electrons from the flood source with high energies, e.g. 70 eV, can also induce high negative potential on wafer surface and may damage the integrated circuits.

For above reasons, the electrons are introduced in the beam generally transverse to the direction of beam projection to produce a neutralization of the beam. The individual ions in the beam are not neutralized since the combination cross-section of an ion and an electron is small. A neutralization of a beam means an effective neutralization of charge within the volume of the beam. The electrons in the neighborhood of the ion beam are attracted by the positive beam potential and travel together with the ion beam. However, with this approach the efficiency of entrapment of electrons within the beam may be low due to the high velocity of the primary electrons emitting from the filament and to the low capture cross-section of the electrons by the beam. Generating electrons with low energies would increase the probability of entrapment.

There are several ways to produce low energy electrons. One is to generate these electrons outside the primary electron source. In this case, a dummy target, usually made of aluminum or graphite, is located on the other side of the ion beam opposite to the electron source. The primary electrons with energies about 70 eV are extracted and strike the target, generating large amount of secondary electrons. Most of these secondary electrons have much lower energies, e.g. less than 10 eV[1], and easier to be trapped with the ion beam. This type of electron flood source has been described in many patents, e.g., D. A. Robertson et al., "Apparatus for enhanced neutralization of positively charged ion beam", U.S. Pat. No. 4,463,255, 1984, V. M. Benveniste, "Ion beam neutralization means generating diffuse secondary emission electron shower", U.S. Pat. No. 5,164,599, 1992, and J. D. Bernstein et al., "Biased and serrated extension tube for ion implanter electron shower", U.S. Pat. No. 5,903,009, 1999. There are several technical difficulties in applying this electron source for ion implantation. Specifically, the primary electrons, through elastic collisions with other electrons, may drift to wafers and produce high electric fields on wafer surfaces thus induces micro-circuitry damage. For effective neutralization, the dummy target has to be close to the ion beam. The patented electron source increases the opportunity for the ion beam to strike the dummy target during beam tuning and create metal particles from the dummy target surface. These particles will drift to the processed wafers and induce metal contamination on wafer surfaces.

[1]Ion Implantation Science and Technology, edited by J. F. Ziegler, p. 576–582, 1996.

The second way to generate low energy electrons is to create them inside the primary electron source. An ionizable gas is introduced into the source. The primary electrons impact the gas atoms, knock off one or more electrons from each atom, and generate plasma in which positive charges (atomic ions) and negative charges (electrons) are almost equal. The electron energies inside the plasma depend on the plasma temperature, and are usually less than 5 eV with narrow distribution. These low energy electrons together with ions, or the plasma, would drift out of the flood source and reach the ion beam, as illustrated in FIG. 1 below in the section of "Detail Description of Preferred Embodiment", therefore this type of source is called plasma flood source. Plasma flood sources have been described in many patents, e.g., H. Ito et al., "Plasma flood system for the reduction of charging of wafers during ion implantation", U.S. Pat. No. 5,399,871, 1995. The possibility to trap the electrons in the ion beam is inverse proportional to the electron velocities. Since the fast moving electrons are dragged by the slowly moving heavy ions from the flood source, the electrons have more time to stay around the ion beam and easier to the trapped in the ion beam. When more ions in the ion beam are neutralized after trapping greater number of electrons, its net beam potential decreases, thus reduces the number of trapped electrons. Therefore, this type of electron flood source can self-regulate the amount of trapped electrons to avoid over or under compensating the positive beam current. Since the electrons from the source have low energy, the wafer damage caused by high-energy electrons can be avoided. There is no dummy target required, and the flood source can be placed far away from the ion beam, therefore there is minimum chance that the ion beam will strike any metal surface near the wafers except the process chamber. However, the discharge inside the flood source can still generate metallic particles such as tungsten, aluminum, or molybdenum, depending the building materials of the flood source housing. These metallic particles can drift out of the source and deposition onto the wafer surfaces.

Reducing metal contamination is important for increasing the yield of integrated circuit manufacturing. A person of ordinary skill in the art still faces the demand of providing an improved flood source that induces much less metal contamination while keeps most advantages of other conventional flood sources.

SUMMARY OF THE PRESENT INVENTION

It is therefore an object of the present invention to provide an apparatus for producing sufficient neutralization of a positively charged beam for better beam transportation, especially for low-energy ion beams.

It is a further object of the present invention to provide an apparatus for producing sufficient low-energy electrons on processed wafers to reduce wafer charging.

It is a further object of the present invention to provide an apparatus that produces minimum amount of metal particles onto processed wafers.

It is an additional object of the present invention to provide an apparatus that can accomplish the above goals with minimum radiation on processed wafers.

To reduce space charge blow-up and charge build-up on wafers, electron floods are usually applied to neutralize the ion beams. Thermal electrons are extracted from the electron flood sources into the ion beams and travel together toward the wafers. The conventional electron floods have secondary electron type and plasma flood type. They can increase beam transmission from the ion source to the wafers and reduce wafer charging at the same time. However, almost all electron flood sources in the market create metal contamination and wafer heating. An improved newly designed plasma flood source is disclosed in this invention that can overcome these problems by sufficient cooling of the flood body. By significantly reducing the temperature of flood body, the bleeding gas pressure inside the flood body is also reduced. The flood extraction aperture area can be increased to provide more neutralizing electrons without affecting gas pressure inside the beam-line. The new plasma flood can provide much more efficient beam neutralization, especial at low ion energy, with minimum metal contamination and wafer heating.

The present invention therefore has the advantages that it provides a new plasma flood source for better space charge neutralization, lower wafer charging, and less metal contamination. The new plasma flood source with better cooling will enable those of ordinary skill in the art to overcome the difficulties, encountered in the prior art.

Specifically, the present invention provides a new plasma flood source with the whole source wall cooled to room temperature. The low temperature environment allows the source wall to be made of aluminum only and eliminates the usage of other metals for the source components, such as molybdenum and copper, except for the tungsten filament. The new plasma flood source confines the possible metal contamination at the wafers to only aluminum and tungsten from the electron flood source.

Another advantage of the present invention is that it provides a new plasma flood source with cooled source wall to reduce aluminum vaporization and increases possibility of tungsten and aluminum deposition onto the cooled source wall. The partial pressure of tungsten and aluminum vapor inside the flood source housing can be greatly reduced. The metal contamination contributed from the flood sources usually comes from the metal vapor drifting out of the source from the flood extraction aperture. When the tungsten and aluminum vapor partial pressure is reduced inside the source, the metal contamination is also reduced.

DETAILED DESCRIPTION OF THE PREFERRED EMBODIMENT

Figure 1:
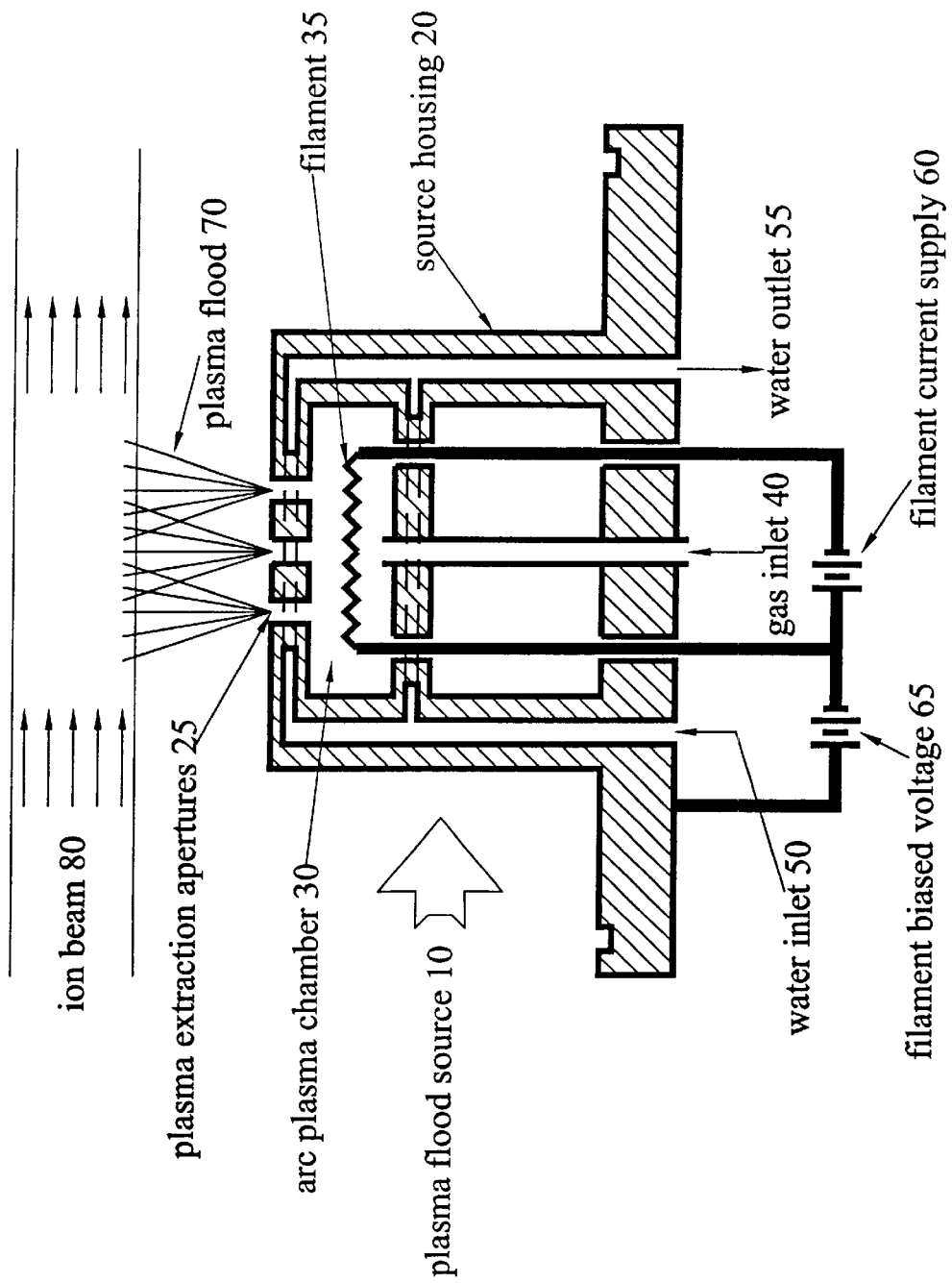
FIG. 1 is a functional block diagram of a plasma flood source of this invention.

The present invention introduces a new plasma flood source that has a cold source housing. FIG. 1 is a functional block diagram for showing the plasma flood source 10 of this invention. The plasma flood source 10 includes a source housing 20 with a hollow wall, an arc plasma chamber 30 in the upper part of the source housing, and a filament 35 inside the arc plasma chamber 30. Cold water flows into the water passway 20' formed in the hollow wall of the source housing 20 from the water inlet 50 and comes out from the water outlet 55 to keep the source housing near room temperature. An ionizable gas is introduced into the arc chamber 30 through the gas inlet 40. When a large current is running through the filament 35 by the filament current supply 60, thermal electrons emit from the filament 35 into the arc chamber 30. When the filament 35 is biased at a negative potential by the filament-biasing voltage 65, the emitting electrons have sufficient kinetic energies to ionize the gas molecules inside the arc chamber 30 and create arc plasma. Electrons and ions in the plasma drift out of the extraction apertures 25 toward the ion beam 80 and form plasma flood 70. The low energy electrons in the flood are trapped in the positive ion beam 80 and neutralize the beam 80.

Figure 2A:
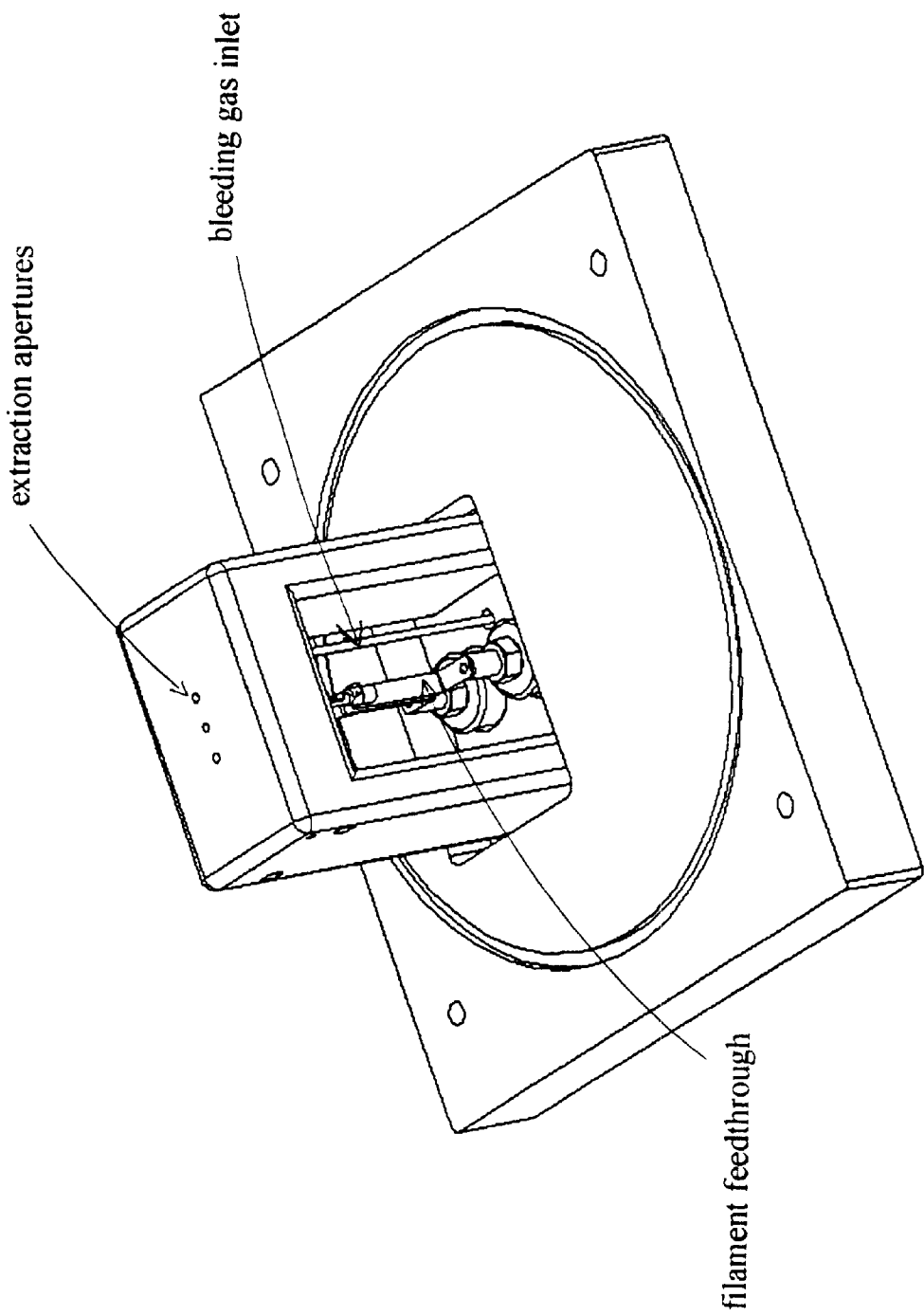
FIG. 2a is a three-dimensional mechanical design diagram of the plasma flood source of this invention, with several plasma extraction apertures in the front source surface.
Figure 2B:
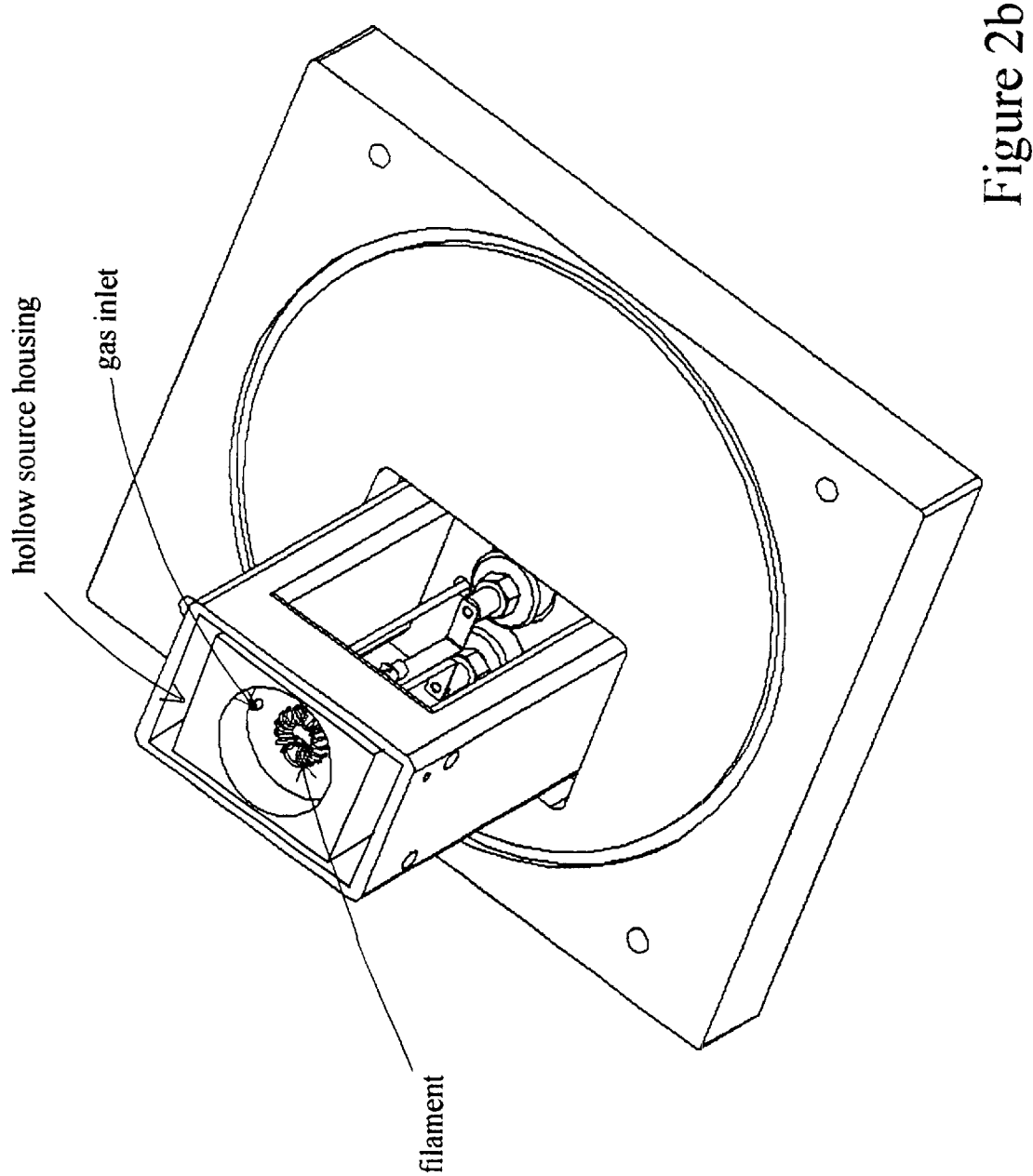
FIG. 2b is a three-dimensional mechanical design diagram of the plasma flood source of this invention, without the front source surface, so that the filament and the water-cooling channel can be seen.

FIG. 2 shows a mechanical design of a plasma flood source of this invention. The hollow source housing and filament are clearly shown in FIG. 2b. The cooling water running through the hollow source housing cools the walls of the arc chamber efficiently.

The flood source external surfaces facing the wafers are near room temperature because of the sufficient water-cooling. The filament is installed at a position so that there is no filament exposure to the wafers through those apertures. Therefore there is not direct radiation from the filament 35 to irradiate on the target wafer thus causes a side effect of wafer heating.

A conventional plasma flood source without sufficient water-cooling can have temperatures as high as 1200K caused by arc discharge from the filament to the arc chamber wall. Metallic particles from the filament and the chamber wall can hardly stick to the hot wall. They will eventually leak out, together with the plasma flood, and cause metal contamination on the processed wafers. In the plasma flood source of this invention, the source housing is cooled to near 300K, a factor of 4 lower than a conventional source. The metallic particles inside the arc chamber have much higher possibility to deposit on the cool chamber wall. The coolant flows through the water channel 20' formed in the hollow wall of the source housing can effectively reduce the metal vapor leaking out of the arc chamber. The difficulty caused by metal contamination on the wafers in applying the plasma flood is therefore significant reduced.

To sufficiently neutralize the ion beam, more plasma flood current needs to be extracted out of the arc chamber, which requires one or multiple extraction apertures with large total area. However, large extraction area causes more bleeding gas leaking into the neutralizing region and increases the vacuum pressure in the region. It is not desirable for the vacuum pressure near the wafer higher that 1E–5 torr. The vacuum pressure in the neutralizing region is proportional to the extraction aperture area and the gas pressure inside the arc chamber. Since the arc chamber pressure is reduced by a factor of 4 comparing to a conventional source as we have discussed above, the extraction aperture area can be increased by a factor of 4 to keep the vacuum pressure unchanged. Larger extraction area can provide more electrons from the source and thus increase beam neutralization efficiency.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A plasma flood source comprising:
   a source housing;
   a gas bleeding inlet for introducing gaseous particles into said source housing;
   a filament disposed in said source housing for transmitting a filament current and emitting thermal electrons therefrom for colliding with said gaseous particles to form a gas plasma with ionized gaseous particles; and
   said source housing comprising a plurality of hollow walls each having a coolant passway for passing coolant therethrough for reducing a temperature of said source housing for depositing a plurality of metallic ions emitted from said filament thereon.

2. The plasma flood source of claim 1 wherein:
   said source housing further comprising holes disposed on one of said hollow walls near said filament constituting plasma extraction apertures for extracting said gas plasma and thermal electrons through said extraction aperture.

3. The plasma flood source of claim 1 wherein:
   said hollow walls of said source housing comprising aluminum hollow walls.

4. The plasma flood source of claim 1 further comprising:
   a coolant inlet for introducing coolant into said coolant passways and a coolant outlet for releasing coolant out for said coolant passways.

5. The plasma flood source of claim 1 further comprising:
   said power supply connected to said filament for generating said filament current for transmitting through said filament.

6. The plasma flood source of claim 5 wherein:
   said power supply connected to said filament further providing a negative voltage bias to said filament relative to said hollow walls.

7. The plasma flood source of claim 1 wherein:
   said filament comprising a tungsten filament.

8. An ion implanting apparatus for introducing an ion beam to an implant target comprising:
   a plasma flood source having source housing comprising a plurality of hollow walls each having a coolant passway for passing coolant therethrough for reducing a temperature of said source housing for depositing a plurality of metallic ions emitted from said filament thereon.

9. A ion implanting apparatus for introducing an ion beam to an implant target comprising:
   a plasma flood source having source housing comprising a plurality of hollow walls each having a coolant passway for passing coolant therethrough for reducing a temperature of said flood source.

10. The ion implanting apparatus of claim 9 wherein:
    said plasma flood source further comprising a gas bleeding inlet for introducing gaseous particles into said source housing.

11. The ion implanting apparatus of claim 10 wherein:
    said plasma flood source further comprising a filament disposed in said source housing for transmitting a filament current and emitting thermal electrons therefrom for colliding with said gaseous particles to form a gas plasma with ionized gaseous particles.

12. The ion implanting apparatus of claim 11 wherein:
    said source housing further comprising holes formed in one of said hollow walls disposed near said filament constituting plasma extraction apertures for extracting said gas plasma and thermal electrons through said extraction aperture.

13. The ion implanting apparatus of claim 9 wherein:
    said hollow walls of said source housing comprising aluminum hollow walls.

14. The ion implanting apparatus of claim 9 wherein:
    said plasma flood source further comprising a coolant inlet for introducing coolant into said coolant passways and a coolant outlet for releasing coolant out for said coolant passways.

15. The ion implanting apparatus of claim 11 wherein:
    said plasma flood source further comprising a power supply connected to said filament for generating said filament current for transmitting through said filament.

16. The ion implanting apparatus of claim 15 wherein:
    said power supply connected to said filament further providing a negative voltage bias to said filament relative to said hollow walls.

17. The ion implanting apparatus of claim 11 wherein:
    said filament comprising a tungsten filament.

18. The ion implanting apparatus of claim 12 wherein:
    said plasma extraction apertures disposed near said ion beam for extracting and introducing said gas plasma and thermal electrons to said ion beam through said extraction apertures.

19. The ion implanting apparatus of claim 18 wherein:
    said plasma flood source is disposed at a particular position relative to said ion beam whereby said gas plasma and thermal electrons are introduced to said ion beam at a direction perpendicular to a beamline of said ion beam through said extraction apertures.

20. A method of introducing electrons into an ion beam for implanting a target wafer comprising:

a) forming a source housing by employing a plurality of hollow walls each having a coolant passway for passing coolant therethrough for reducing a temperature of said source housing near a room temperature.

21. The method of claim 20 further comprising:

b) introducing gaseous particles into said source housing through a gas bleeding inlet.

22. The method of claim 21 further comprising:

c) transmitting a filament current through a filament disposed in said source housing for emitting thermal electrons therefrom for colliding with said gaseous particles to form a gas plasma with ionized gaseous particles.

23. The method claim 22 further comprising:

d) extracting said gas plasma and thermal electrons through holes formed as plasma extraction apertures in one of said hollow walls near said filament.

24. The method of claim 20 wherein:

said step a) of forming said source housing with said hollow walls comprising a step a1) of forming said hollow walls as aluminum hollow walls.

25. The method of claim 20 wherein:

said step a) of forming said source housing with said hollow walls further comprising a step a2) of providing a coolant inlet for introducing coolant into said coolant passways and a step a3) of providing a coolant outlet for releasing coolant out for said coolant passways.

26. The method of claim 22 wherein:

said step c) of transmitting a filament current through a filament further comprising a step c1) of connecting a power supply to said filament for generating said filament current for transmitting through said filament.

27. The method of claim 26 wherein:

said step c1) of connecting said power supply to said filament further comprising a step of c2) providing a negative voltage bias to said filament relative to said hollow walls.

28. The method of claim 22 wherein:

said step of transmitting a filament current through a filament further comprising a step c3) of transmitting said filament current through a tungsten filament in said source housing.

29. The method of claim 23 wherein:

said step d) of extracting said gas plasma and thermal electrons through said plasma extraction apertures further comprising a step of d1) extracting and introducing said gas plasma and thermal electrons to said ion beam through said extraction apertures.

30. The method of claim 29 wherein:

said step d1) of extracting and introducing said gas plasma and thermal electrons to said ion beam through said extraction apertures plasma flood source further comprising a step of d2) introducing said gas plasma and thermal electrons to said ion beam at a direction perpendicular to a beamline of said ion beam through said extraction apertures.

31. The method of claim 20 wherein:

said step a) of forming a source housing by employing a plurality of hollow walls each having a coolant passway for passing coolant therethrough further comprising a step a1) of passing coolant for reducing a temperature of said plasma flood source from near 1200K to near 300K.

32. The method of claim 31 wherein:

said step a) of forming a source housing by employing a plurality of hollow walls each having a coolant passway for passing coolant therethrough further comprising a step a2) of passing coolant for reducing a gas pressure inside said source housing by a factor of 4 substantially according to a formula of p=nkT, where n is a gas density, p a pressure, T a temperature, and k a Boltzman constant.

33. The method of claim 28 wherein:

said step a) of forming a source housing by employing a plurality of hollow walls each having a coolant passway for passing coolant therethrough further comprising a step a2) of passing coolant for reducing a gas pressure inside said source housing by a factor of 4 substantially according to a formula of p=nkT, where n is a gas density, p a pressure, T a temperature, and k a Boltzman constant; and said step d1) of extracting and introducing said gas plasma and thermal electrons to said ion beam through said extraction apertures plasma flood source further comprising a step of d3) of opening each of said extraction apertures with an open area corresponding a said source housing pressure for introducing said electrons to said ion beam.

34. A method of reducing metal contamination by a plasma flood source to an implanting ion beam comprising:

a) providing a cooling means for reducing a temperature of said plasma flood source to reduce metal ions introduced to said implanting ion beam emitted from said plasma flood source.

35. The method of claim 34 further comprising a step of:

forming said plasma flood source with aluminum and tungsten wherein said step of reducing a temperature of said plasma flood source is a step of reducing tungsten and aluminum ions emitted from said plasma flood source.

* * * * *